United States Patent
Uchida et al.

(10) Patent No.: US 9,209,085 B2
(45) Date of Patent: Dec. 8, 2015

(54) WAFER PROCESSING METHOD

(71) Applicant: DISCO CORPORATION, Tokyo (JP)

(72) Inventors: Fumio Uchida, Tokyo (JP); Yoshihiro Tsutsumi, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/572,917

(22) Filed: Dec. 17, 2014

(65) Prior Publication Data

US 2015/0187650 A1 Jul. 2, 2015

(30) Foreign Application Priority Data

Dec. 26, 2013 (JP) ................................. 2013-268612

(51) Int. Cl.
*H01L 21/78* (2006.01)
(52) U.S. Cl.
CPC ..................................... *H01L 21/78* (2013.01)
(58) Field of Classification Search
CPC .................... H01L 21/78; H01L 2221/68336; H01L 21/463; H01L 21/6836; H01L 2221/68327; H01L 24/95; H01L 21/304; H01L 24/94; H01L 2223/5446; H01L 2224/82039; H01L 24/97
USPC .............................. 438/33, 68, 113, 458–465
See application file for complete search history.

(56) References Cited

U.S. PATENT DOCUMENTS

| | | | | |
|---|---|---|---|---|
| 5,284,792 A | * | 2/1994 | Forster | H01S 5/0201 148/DIG. 28 |
| 9,105,708 B2 | * | 8/2015 | Uchida | H01L 21/78 1/1 |
| 2005/0095750 A1 | * | 5/2005 | Lo | H01L 21/56 438/114 |
| 2008/0233712 A1 | * | 9/2008 | Sekiya | H01L 21/6835 438/462 |
| 2009/0280622 A1 | * | 11/2009 | Genda | H01L 21/78 438/462 |
| 2010/0041210 A1 | * | 2/2010 | Hoshino | H01L 21/67132 438/463 |
| 2012/0156858 A1 | * | 6/2012 | Sekiya | B23K 26/0063 438/458 |
| 2015/0104930 A1 | * | 4/2015 | Aikawa | H01L 21/78 438/462 |

FOREIGN PATENT DOCUMENTS

JP 2005-064231 3/2005

* cited by examiner

*Primary Examiner* — Thanh T Nguyen
(74) *Attorney, Agent, or Firm* — Greer Burns & Crain Ltd.

(57) ABSTRACT

A wafer processing method includes a functional layer cutting step of applying a laser beam along each division line formed on a functional layer to thereby ablate the functional layer and form a laser processed groove along each division line. A protective member is attached to the front side of the functional layer. A groove is cut by positioning a cutting blade on the back side of the substrate in the area corresponding to each division line. The cut groove has a depth not reaching the functional layer. A dicing tape is attached to the back side of the substrate to support the outer circumferential portion of the dicing tape to an annular frame. The protective member is peeled off and the dicing tape attached to the back side of the substrate is expanded to increase the spacing between the devices.

3 Claims, 11 Drawing Sheets

WAFER PROCESSING METHOD

BACKGROUND OF THE INVENTION

1. Field of the Invention

The present invention relates to a wafer processing method for dividing a wafer into a plurality of individual devices along a plurality of crossing division lines, the wafer being composed of a substrate and a functional layer formed on the front side of the substrate, the division lines being formed on the front side of the functional layer to thereby define a plurality of separate regions where the devices are respectively formed.

2. Description of the Related Art

As well known in the art, in a semiconductor device fabrication process, a functional layer composed of an insulating film and a functional film is formed on the front side of a substrate such as a silicon substrate, and a plurality of devices such as ICs and LSIs are formed like a matrix from this functional layer, thus obtaining a semiconductor wafer having the plural devices. The plural devices are partitioned by a plurality of crossing division lines formed on the front side of the semiconductor wafer. The semiconductor wafer is divided along these division lines to obtain the individual devices.

In recent years, a semiconductor wafer intended to improve the processing performance of semiconductor chips (devices) such as ICs and LSIs has been put into practical use. This semiconductor wafer is composed of a substrate such as a silicon substrate and a functional layer formed on the front side of the substrate, wherein the functional layer is composed of a low-permittivity insulator film (low-k film) and a functional film formed on the low-k film, the functional film forming a plurality of circuits. Thus, the semiconductor devices are formed from the functional layer. The low-k film is formed from an inorganic film of SiOF, BSG (SiOB), etc. or an organic film such as a polymer film of polyimide, parylene, etc.

Division of such a semiconductor wafer along the division lines is usually performed by using a cutting apparatus called a dicing saw. This cutting apparatus includes a chuck table for holding the semiconductor wafer as a workpiece, cutting means for cutting the semiconductor wafer held on the chuck table, and moving means for relatively moving the chuck table and the cutting means. The cutting means includes a rotating spindle adapted to be rotated at high speeds and a cutting blade mounted on the rotating spindle. The cutting blade is composed of a disk-shaped base and an annular cutting edge mounted on one side surface of the base along the outer circumference thereof. The annular cutting edge is an electroformed diamond blade formed by bonding diamond abrasive grains having a grain size of about 3 µm, for example. The cutting edge has a thickness of about 30 µm, for example.

However, it is difficult to cut the low-k film by using the cutting blade. That is, the low-k film is very brittle like mica. Accordingly, when the semiconductor wafer having the low-k film is cut along the division lines by using the cutting blade, there arises a problem such that the low-k film may be separated and this separation (delamination) may reach the devices (circuits) to cause fatal damage to the devices.

To solve this problem, Japanese Patent Laid-open No. 2005-64231 discloses a wafer dividing method including the steps of applying a laser beam along the division lines formed on a semiconductor wafer to form a laser processed groove along each division line, thereby dividing the functional layer, and next positioning a cutting blade in alignment with the laser processed groove along each division line to relatively move the cutting blade and the semiconductor wafer, thereby cutting the semiconductor wafer along each division line.

SUMMARY OF THE INVENTION

In the wafer dividing method disclosed in Japanese Patent Laid-open No. 2005-64231 mentioned above, a laser beam is applied along each division line formed on the semiconductor wafer to thereby form the laser processed groove dividing the functional layer along each division line. Thereafter, the cutting blade is positioned in alignment with the laser processed groove and operated to cut the semiconductor wafer along each division line. Accordingly, this conventional method has the following problems.

(1) Even if the width of the laser processed groove is sufficient, the cutting blade may come into contact with debris sticking to the side surfaces of the laser processed groove, causing a problem such that the outer edge of each device may be suddenly chipped.

(2) When the removal of the functional layer in forming the laser processed groove is insufficient, the cutting blade may be deviated or tilted to cause the delamination of the functional layer in each device.

(3) Since the width of the laser processed groove must be set to a value larger than the width of the cutting blade, the width of each division line must be increased to cause a decrease in number of devices that can be formed on the wafer.

It is therefore an object of the present invention to provide a wafer processing method which can divide a wafer into a plurality of individual devices along a plurality of crossing division lines without the above problems, wherein the wafer is composed of a substrate and a functional layer formed on the front side of the substrate, and the division lines are formed on the front side of the functional layer to thereby define a plurality of separate regions where the devices are respectively formed.

In accordance with an aspect of the present invention, there is provided a wafer processing method for dividing a wafer into a plurality of individual devices along a plurality of crossing division lines, the wafer being composed of a substrate and a functional layer formed on the front side of the substrate, the division lines being formed on the front side of the functional layer to thereby define a plurality of separate regions where the devices are respectively formed, the wafer processing method including a functional layer cutting step of applying a laser beam along each division line formed on the functional layer of the wafer to thereby ablate the functional layer and form a laser processed groove cutting the functional layer along each division line; a protective member attaching step of attaching a protective member to the front side of the functional layer of the wafer after performing the functional layer cutting step; a cut groove forming step of holding the wafer on a chuck table in the condition where the protective member is in contact with the chuck table after performing the protective member attaching step, and next positioning a cutting blade on the back side of the substrate of the wafer in the area corresponding to each division line to form a cut groove having a depth not reaching the functional layer; a wafer supporting step of attaching a dicing tape to the back side of the substrate of the wafer after performing the cut groove forming step, supporting the outer circumferential portion of the dicing tape to an annular frame, and next peeling off the protective member; and a tape expanding step of expanding the dicing tape attached to the back side of the substrate of the wafer to increase the spacing between the devices after performing the wafer supporting step.

Preferably, the cut groove formed in the cut groove forming step has a depth not reaching the bottom of the laser processed groove cutting the functional layer, and the substrate is broken along the cut groove by expanding the dicing tape in the tape expanding step to thereby divide the wafer into the individual devices. Alternatively, the cut groove formed in the cut groove forming step has a depth reaching the bottom of the laser processed groove cutting the functional layer, thereby dividing the wafer into the individual devices.

According to the wafer processing method of the present invention, the following effects can be obtained.

(1) Even when debris sticks to the side surfaces of the laser processed groove formed in the functional layer by the ablation in the functional layer cutting step (laser processing step), there is no possibility that the outer edge of each device may be suddenly chipped by the contact of the cutting blade with the debris, because the cutting blade does not cut the functional layer in the area where the laser processed groove is formed.

(2) Even when the removal of the functional layer by the ablation in the functional layer cutting step (laser processing step) is insufficient, there is no possibility that the delamination of the functional layer may occur, because the wafer can be divided into the individual devices by forming the cut groove from the back side of the substrate so that the cut groove reaches the laser processed groove, and the cutting blade does not cut the functional layer in the area where the laser processed groove is formed.

(3) It is unnecessary to set the width of the laser processed groove to a value larger than the width of the cutting blade, so that the width of each division line can be reduced to thereby increase the number of devices that can be formed on the wafer.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
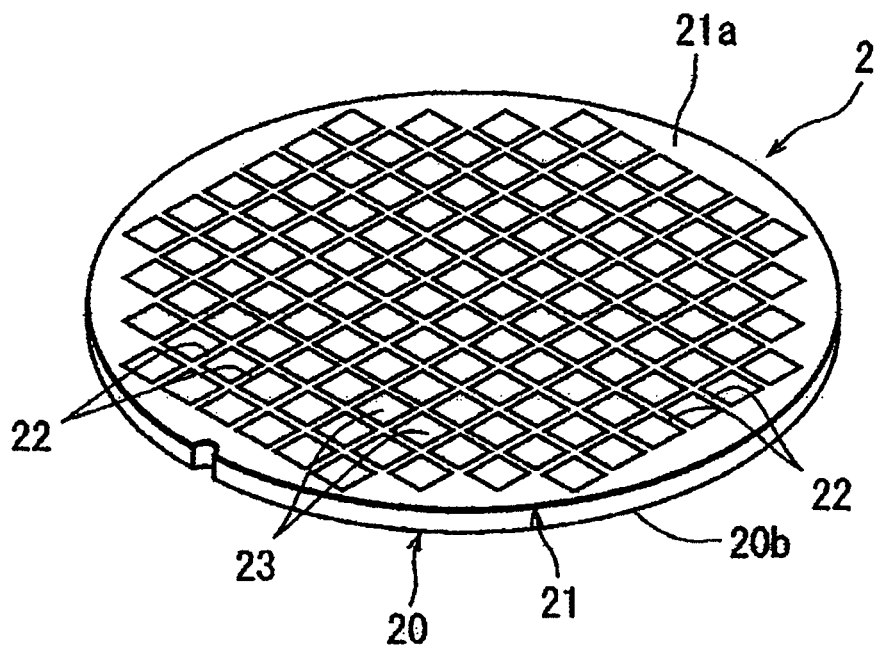
FIG. 1A is a perspective view showing a semiconductor wafer to be divided by the wafer processing method according to the present invention.
Figure 1B:
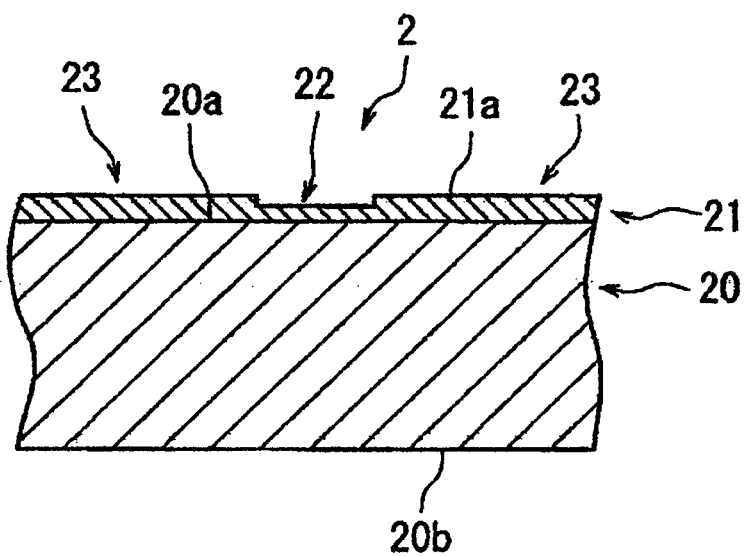
FIG. 1B is an enlarged sectional view of an essential part of the semiconductor wafer shown in FIG. 1A.

The wafer processing method according to the present invention will now be described in more detail with reference to the attached drawings. FIG. 1A is a perspective view of a semiconductor wafer 2 to be divided into individual devices by the wafer processing method according to the present invention, and FIG. 1B is an enlarged sectional view of an essential part of the semiconductor wafer 2 shown in FIG. 1A. As shown in FIGS. 1A and 1B, the semiconductor wafer 2 is composed of a substrate 20 such as a silicon substrate and a functional layer 21 formed on the front side 20a of the substrate 20. For example, the substrate 20 has a thickness of 140 μm. The functional layer 21 is composed of an insulating film and a functional film formed on the insulating film, the functional film forming a plurality of circuits. A plurality of crossing division lines 22 are formed on the front side 21a of the functional layer 21 to thereby define a plurality of separate regions where a plurality of devices 23 such as ICs and LSIs are respectively formed. In this preferred embodiment, the insulating film constituting the functional layer 21 is provided by an SiO2 film or a low-permittivity insulator film (low-k film). Examples of the low-k film include an inorganic film of SiOF, BSG (SiOB), etc. and an organic film such as a polymer film of polyimide, parylene, etc. For example, the thickness of the insulating film is set to 10 μm.

Figure 2:
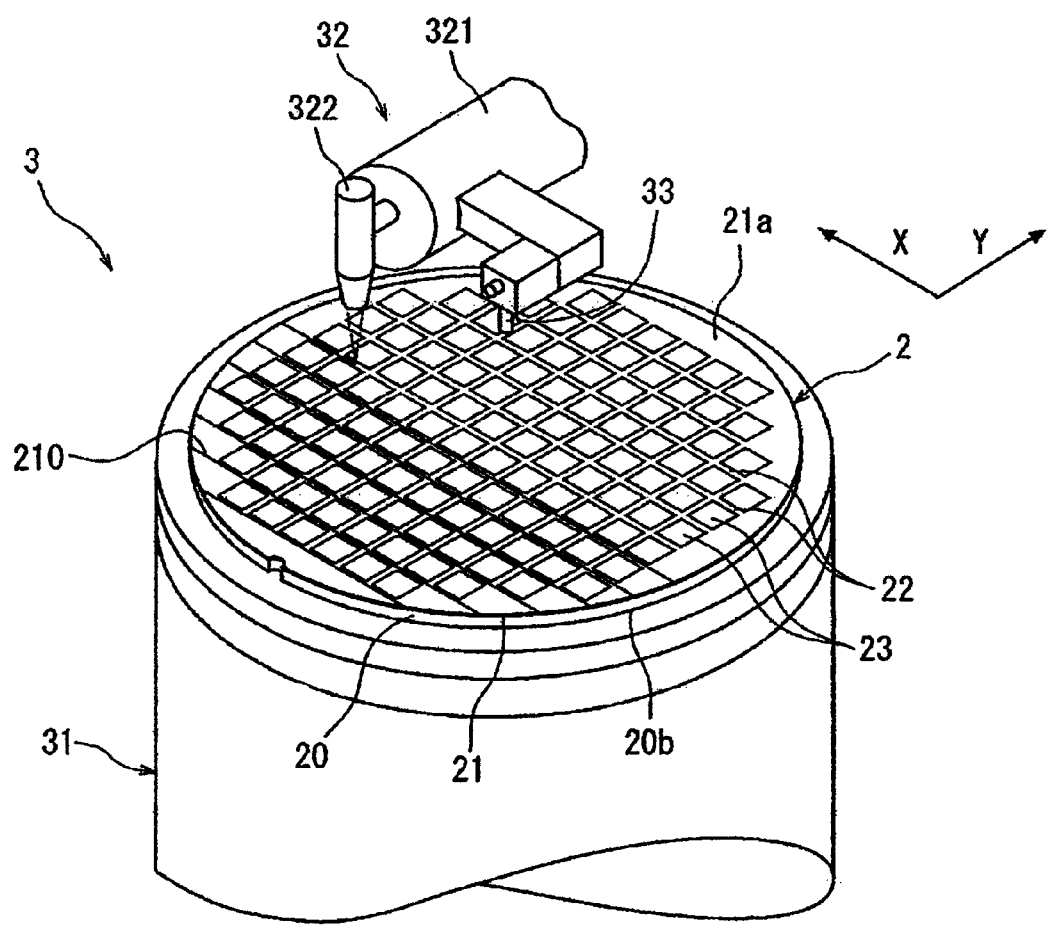
FIG. 2 is a perspective view of an essential part of a laser processing apparatus for performing a functional layer cutting step.

The wafer processing method for dividing the semiconductor wafer 2 along the division lines 22 will now be described. First, a functional layer cutting step is performed in such a manner that a laser beam is applied along each division line 22 formed on the functional layer 21 of the semiconductor wafer 2 to thereby ablate the functional layer 21 and form a laser processed groove cutting the functional layer 21 along each division line 22. This functional layer cutting step is performed by using a laser processing apparatus 3 shown in FIG. 2. As shown in FIG. 2, the laser processing apparatus 3 includes a chuck table 31 for holding a workpiece, laser beam applying means 32 for applying a laser beam to the workpiece held on the chuck table 31, and imaging means 33 for imaging the workpiece held on the chuck table 31. The chuck table 31 has an upper surface as a holding surface for holding the workpiece thereon under suction. The chuck table 31 is movable both in the feeding direction shown by an arrow X in FIG. 2 by feeding means (not shown) and in the indexing direction shown by an arrow Y in FIG. 2 by indexing means (not shown).

The laser beam applying means 32 includes a cylindrical casing 321 extending in a substantially horizontal direction. Although not shown, the casing 321 contains pulsed laser beam oscillating means including a pulsed laser beam oscillator and repetition frequency setting means. The laser beam applying means 32 further includes focusing means 322 mounted on the front end of the casing 321 for focusing a pulsed laser beam oscillated by the pulsed laser beam oscillating means. The laser beam applying means 32 further includes focal position adjusting means (not shown) for adjusting the focal position of the pulsed laser beam to be focused by the focusing means 322.

The imaging means 33 is mounted on a front end portion of the casing 321 constituting the laser beam applying means 32 and includes illuminating means for illuminating the workpiece, an optical system for capturing an area illuminated by the illuminating means, and an imaging device (CCD) for imaging the area captured by the optical system. An image signal output from the imaging means 33 is transmitted to control means (not shown).

There will now be described with reference to FIG. 2 and FIGS. 3A to 3C the functional layer cutting step of applying a laser beam along each division line 22 formed on the functional layer 21 of the semiconductor wafer 2 to thereby ablate the functional layer 21 and form a laser processed groove cutting the functional layer 21 along each division line 22 by using the laser processing apparatus 3 mentioned above.

First, the semiconductor wafer 2 is placed on the chuck table 31 of the laser processing apparatus 3 in the condition where the back side 20b of the substrate 20 of the semiconductor wafer 2 is in contact with the chuck table 31 as shown in FIG. 2. Thereafter, suction means (not shown) is operated to hold the semiconductor wafer 2 on the chuck table 31 under suction (wafer holding step). Accordingly, the front side 21a of the functional layer 21 of the semiconductor wafer 2 held on the chuck table 31 is oriented upward. Thereafter, the chuck table 31 holding the semiconductor wafer 2 is moved to a position directly below the imaging means 33 by operating the feeding means (not shown).

In the condition where the chuck table 31 is positioned directly below the imaging means 33, an alignment operation is performed by the imaging means 33 and the control means (not shown) to detect a subject area of the semiconductor wafer 2 to be laser-processed. More specifically, the imaging means 33 and the control means perform image processing such as pattern matching for making the alignment of the division lines 22 extending in a first direction on the functional layer 21 of the semiconductor wafer 2 and the focusing means 322 of the laser beam applying means 32 for applying the laser beam to the wafer 2 along the division lines 22, thus performing the alignment of a laser beam applying position (alignment step). Similarly, the alignment of a laser beam applying position is performed for the other division lines 22 extending in a second direction perpendicular to the first direction on the functional layer 21.

Figure 3A:
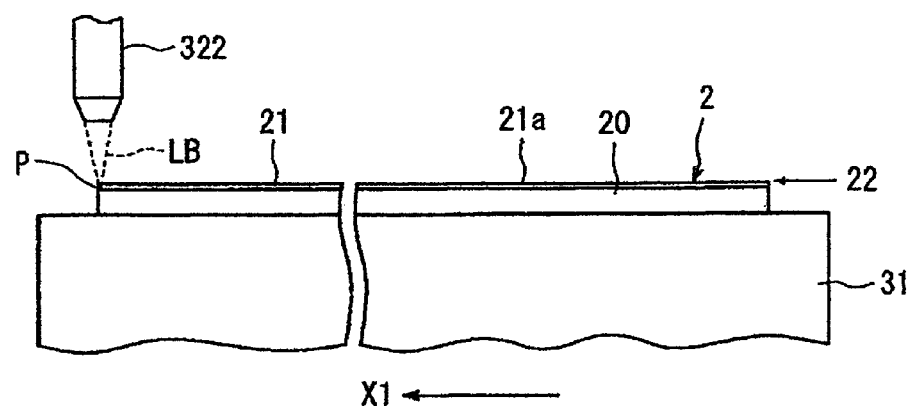
FIGS. 3A to 3C are views for illustrating the functional layer cutting step.

After performing the alignment step mentioned above, the chuck table 31 is moved to a laser beam applying area where the focusing means 322 of the laser beam applying means 32 is located as shown in FIG. 3A, thereby positioning one end (left end as viewed in FIG. 3A) of a predetermined one of the division lines 22 directly below the focusing means 322. Further, the focal point P of the pulsed laser beam LB to be applied from the focusing means 322 is set near the upper surface of the predetermined division line 22. Thereafter, the pulsed laser beam LB is applied from the focusing means 322 to the wafer 2, and the chuck table 31 is moved in the direction shown by an arrow X1 in FIG. 3A at a predetermined feed speed. When the other end (right end as viewed in FIG. 3B) of the predetermined division line 22 reaches the position directly below the focusing means 322 as shown in FIG. 3B, the application of the pulsed laser beam is stopped and the movement of the chuck table 31 is also stopped.

Figure 3B:
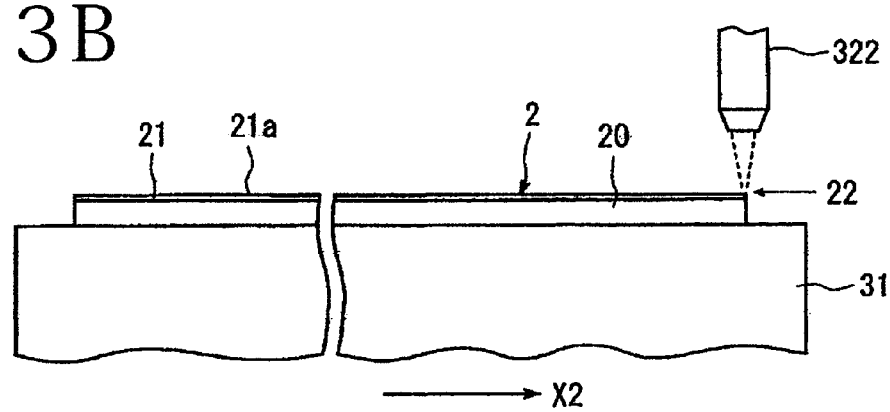

Thereafter, the chuck table 31 is moved by the pitch of the division lines 22 in the direction (indexing direction) perpendicular to the sheet plane of FIG. 3B. Thereafter, the pulsed laser beam is applied from the focusing means 322 to the wafer 2, and the chuck table 31 is moved in the direction shown by an arrow X2 in FIG. 3B at the predetermined feed speed, thereby applying the pulsed laser beam along the next division line 22 extending in the first direction. When the left end of the next division line 22 as viewed in FIG. 3B reaches the position directly below the focusing means 322, the application of the pulsed laser beam is stopped and the movement of the chuck table 31 is also stopped.

Figure 3C:
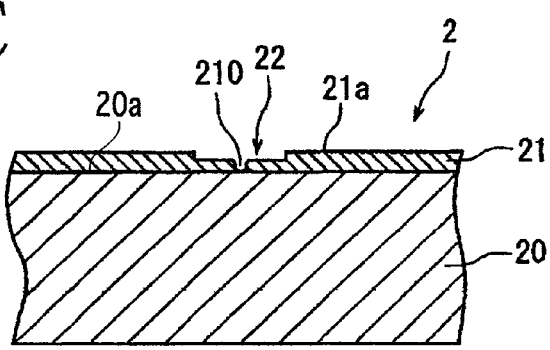

By performing the functional layer cutting step mentioned above, a laser processed groove 210 cutting the functional layer 21 is formed along each division line 22 so that the laser processed groove 210 has a depth reaching the front side 20a of the substrate 20 of the semiconductor wafer 2 as shown in FIG. 3C. The functional layer cutting step mentioned above is similarly performed along all of the division lines 22 formed on the functional layer 21 of the semiconductor wafer 2.

For example, the functional layer cutting step mentioned above is performed under the following processing conditions.

Figure 4:
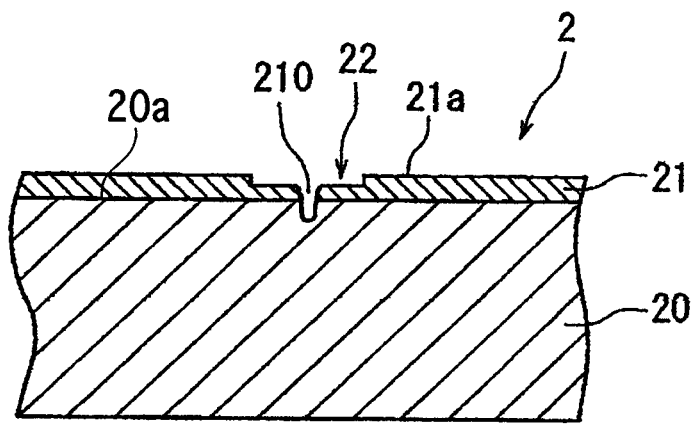
FIG. 4 is an enlarged sectional view of an essential part of a wafer processed by a modification of the functional layer cutting step.

Wavelength of the laser beam: 355 nm
Repetition frequency: 200 kHz
Power: 2 W
Focused spot diameter: φ6 μm
Work feed speed: 500 mm/second A modification of the functional layer cutting step will now be described with reference to FIG. 4. In the modification shown in FIG. 4, a laser processed groove 210 cutting the functional layer 21 is formed along each division line 22 so that the laser processed groove 210 has a depth reaching a position slightly below the front side 20a of the substrate 20 of the semiconductor wafer 2.

Figure 5A:
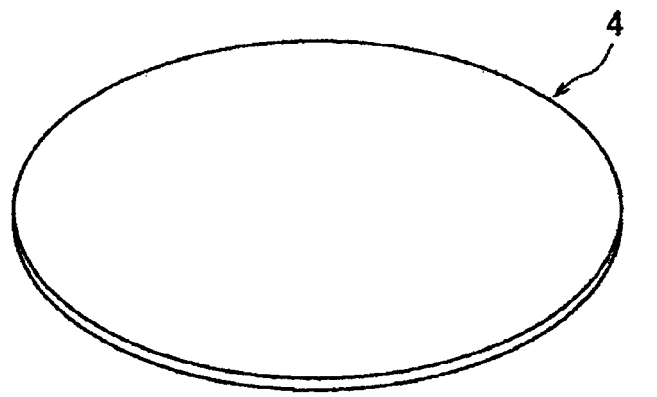
FIGS. 5A and 5B are perspective views for illustrating a protective member attaching step.
Figure 5A:
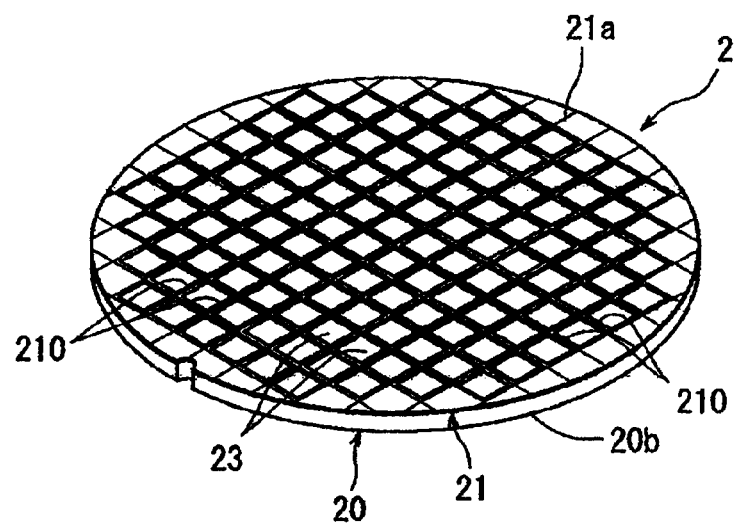
Figure 5B:
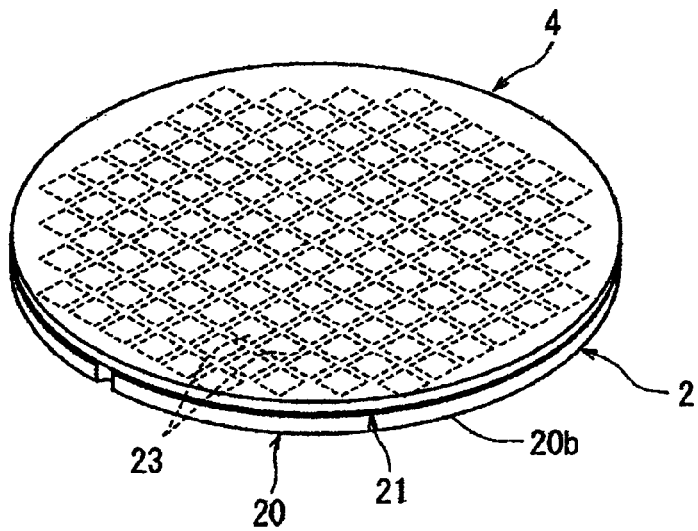

After performing the functional layer cutting step mentioned above, a protective member attaching step is performed in such a manner that a protective member is attached to the front side 21a of the functional layer 21 of the semiconductor wafer 2. More specifically, as shown in FIGS. 5A and 5B, a protective member 4 for protecting the devices 23 is attached to the front side 21a of the functional layer 21 of the semiconductor wafer 2 (protective member attaching step). Examples of the protective member 4 include a resin sheet such as a polyethylene film and a hard plate having rigidity such as a glass plate.

Figure 6:
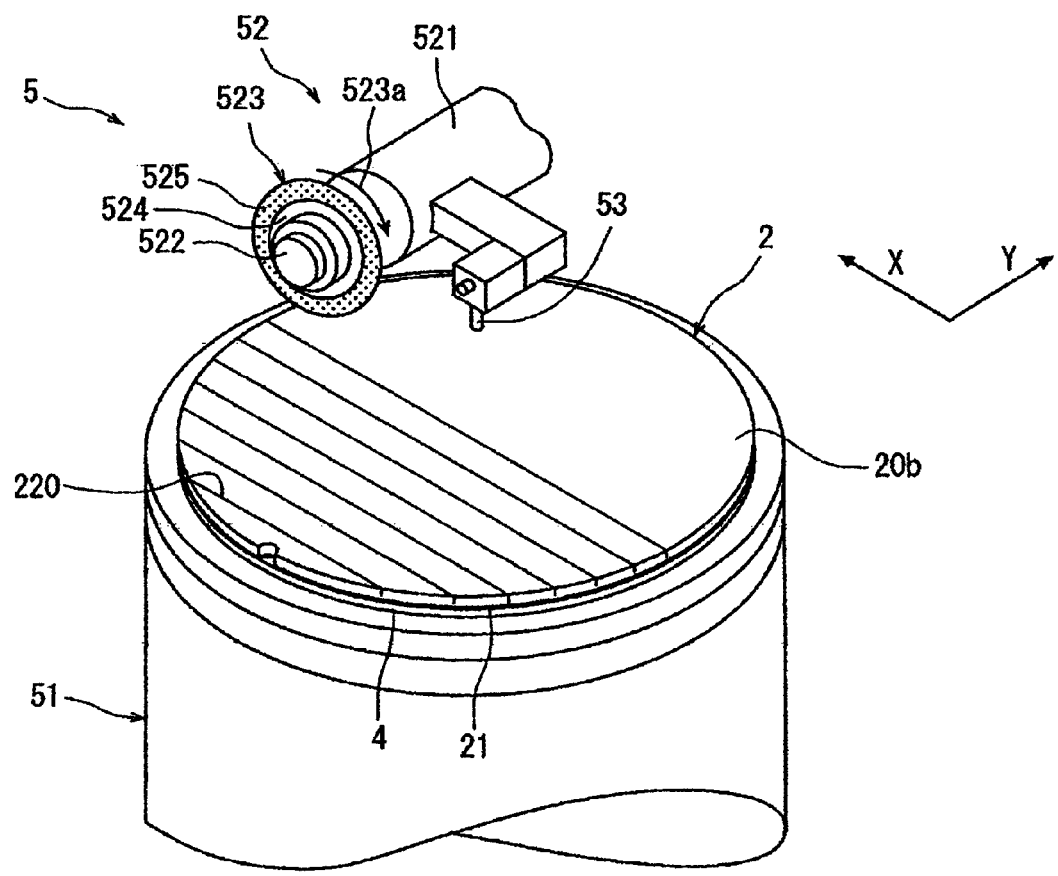
FIG. 6 is a perspective view of an essential part of a cutting apparatus for performing a cut groove forming step.

After performing the protective member attaching step, a cut groove forming step is performed in such a manner that the semiconductor wafer 2 is held on a chuck table in the condition where the protective member 4 is in contact with the chuck table and a cutting blade is next positioned on the back side 20b of the substrate 20 of the semiconductor wafer 2 in the area corresponding to each division line 22 to form a cut groove having a depth not reaching the functional layer 21. This cut groove forming step is performed by using a cutting apparatus 5 shown in FIG. 6. As shown in FIG. 6, the cutting apparatus 5 includes a chuck table 51 for holding a workpiece, cutting means 52 for cutting the workpiece held on the chuck table 51, and imaging means 53 for imaging the workpiece held on the chuck table 51. The chuck table 51 has an upper surface as a holding surface for holding the workpiece thereon under suction. The chuck table 51 is movable both in the feeding direction shown by an arrow X in FIG. 6 by feeding means (not shown) and in the indexing direction shown by an arrow Y in FIG. 6 by indexing means (not shown).

The cutting means 52 includes a spindle housing 521 extending in a substantially horizontal direction, a rotating spindle 522 rotatably supported to the spindle housing 521, and a cutting blade 523 mounted on the rotating spindle 522 at a front end portion thereof. The rotating spindle 522 is adapted to be rotated in the direction shown by an arrow 523a by a servo motor (not shown) provided in the spindle housing 521. The cutting blade 523 is composed of a disk-shaped base 524 formed of aluminum and an annular cutting edge 525 mounted on one side surface of the base 524 along the outer circumference thereof. The annular cutting edge 525 is an electroformed diamond blade produced by bonding diamond abrasive grains having a grain size of 3 to 4 μm with nickel plating to the side surface of the outer circumferential portion of the base 524. For example, the cutting edge 525 has a thickness of 40 μm and an outer diameter of 52 mm.

The imaging means 53 is mounted on a front end portion of the spindle housing 521 and includes an ordinary imaging device (CCD) for imaging the workpiece by using visible light, infrared light applying means for applying infrared light to the workpiece, an optical system for capturing the infrared light applied by the infrared light applying means, and an imaging device (infrared CCD) for outputting an electrical signal corresponding to the infrared light captured by the optical system. An image signal output from the imaging means 53 is transmitted to control means (not shown).

In performing the cut groove forming step by using the cutting apparatus 5 mentioned above, the semiconductor wafer 2 processed by the protective member attaching step is placed on the chuck table 51 in the condition where the protective member 4 is in contact with the chuck table 51 as shown in FIG. 6. Thereafter, suction means (not shown) is operated to hold the semiconductor wafer 2 through the protective member 4 on the chuck table 51 under suction (wafer holding step). Accordingly, the back side 20b of the substrate 20 of the semiconductor wafer 2 held on the chuck table 51 is oriented upward. Thereafter, the chuck table 51 holding the semiconductor wafer 2 is moved to a position directly below the imaging means 53 by operating the feeding means (not shown).

In the condition where the chuck table 51 is positioned directly below the imaging means 53, an alignment operation is performed by the imaging means 53 and the control means (not shown) to detect a subject area of the semiconductor wafer 2 to be cut. More specifically, the imaging means 53 and the control means perform image processing such as pattern matching for making the alignment of the cutting blade 523 and the area corresponding to each division line 22 extending in the first direction on the functional layer 21 of the semiconductor wafer 2, thus performing the alignment of a cut area by the cutting blade 523 (alignment step). Similarly, the alignment of a cut area by the cutting blade 523 is performed for the area corresponding to each division line 22 extending in the second direction perpendicular to the first direction on the functional layer 21. Although the front side 21a of the functional layer 21 where the division lines 22 are formed is oriented downward, the division lines 22 can be imaged through the substrate 20 from the back side 20b thereof because the imaging means 53 includes the infrared light applying means for applying infrared light, the optical system for capturing the infrared light, and the imaging device (infrared CCD) for outputting an electrical signal corresponding to the infrared light as described above.

After performing the alignment step mentioned above to detect the area corresponding to each division line 22 of the semiconductor wafer 2 held on the chuck table 51, the chuck table 51 is moved to a cut start position in the cut area by the cutting blade 523, thereby positioning one end (left end as viewed in FIG. 7A) of a predetermined one of the areas corresponding to the division lines 22 on the right side of a position directly below the cutting blade 523 by a predetermined amount.

Figure 7A:
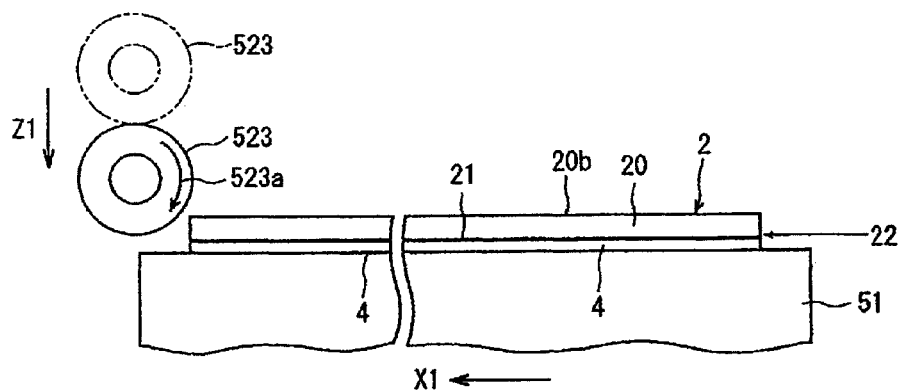
FIGS. 7A to 7D are views for illustrating the cut groove forming step.
Figure 7B:
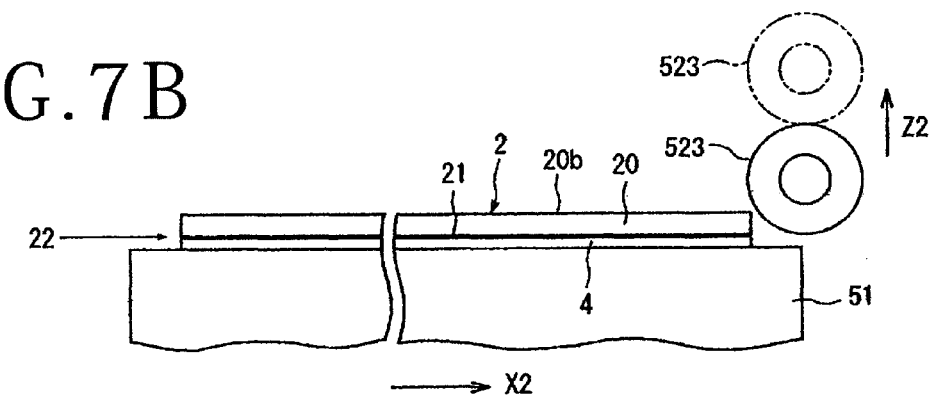
Figures 7C, 7D:
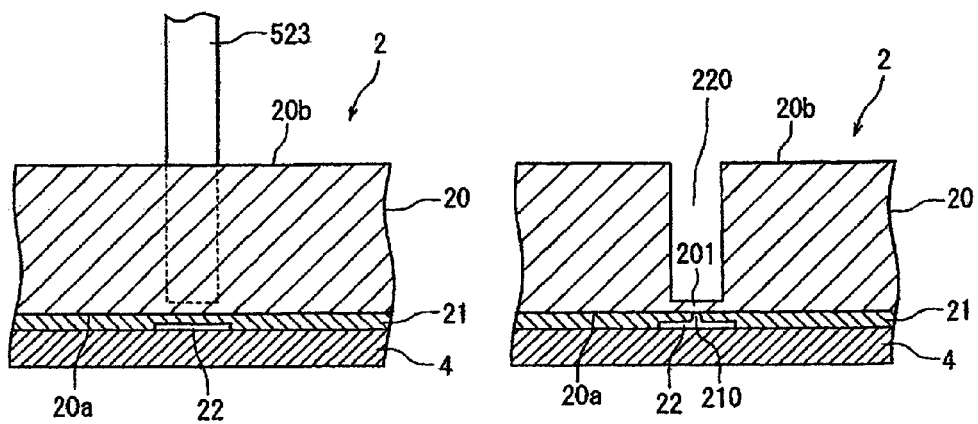

In the condition where the semiconductor wafer 2 held on the chuck table 51 is set at the cut start position in the cut area as described above, the cutting blade 523 is lowered from a standby position shown by a phantom line in FIG. 7A to a working position shown by a solid line in FIG. 7A as shown by an arrow Z1 in FIG. 7A. As shown in FIGS. 7A and 7C, this working position is set so that the lower end of the cutting blade 523 does not reach the functional layer 21 of the semiconductor wafer 2 (e.g., a position slightly above the front side 20a of the substrate 20 toward the back side 20b thereof by an amount of 5 to 10 μm).

Thereafter, the cutting blade 523 is rotated in the direction shown by an arrow 523a in FIG. 7A at a predetermined rotational speed, and the chuck table 51 is moved in the direction shown by an arrow X1 in FIG. 7A at a predetermined feed speed. When the other end (right end as viewed in FIG. 7B) of the predetermined area corresponding to the predetermined division line 22 reaches a position on the left side of the position directly below the cutting blade 523 by a predetermined amount as shown in FIG. 7B, the movement of the chuck table 51 is stopped. As a result, a cut groove 220 is formed on the back side 20b of the substrate 20 of the semiconductor wafer 2 in the condition where a part 201 is left near the front side 20a of the substrate 20 as shown in FIG. 7D (cut groove forming step). In other words, the cut groove 220 has a depth not reaching the bottom of the laser processed groove 210 cutting the functional layer 21.

Thereafter, the cutting blade 523 is raised from the working position to the standby position as shown by an arrow Z2 in FIG. 7B, and the chuck table 51 is next moved in the direction shown by an arrow X2 in FIG. 7B to the position shown in FIG. 7A. Thereafter, the chuck table 51 is moved in the direction (indexing direction) perpendicular to the sheet plane of FIG. 7A by an amount corresponding to the pitch of the division lines 22, thereby aligning the cutting blade 523 with the area corresponding to the next division line 22. In the condition where the cutting blade 523 is aligned with the area corresponding to the next division line 22 as mentioned above, the cut groove forming step is performed similarly. In this manner, the cut groove forming step mentioned above is performed similarly along the areas corresponding to all of the division lines 22 of the semiconductor wafer 2.

For example, the cut groove forming step is performed under the following processing conditions.

Figure 8:
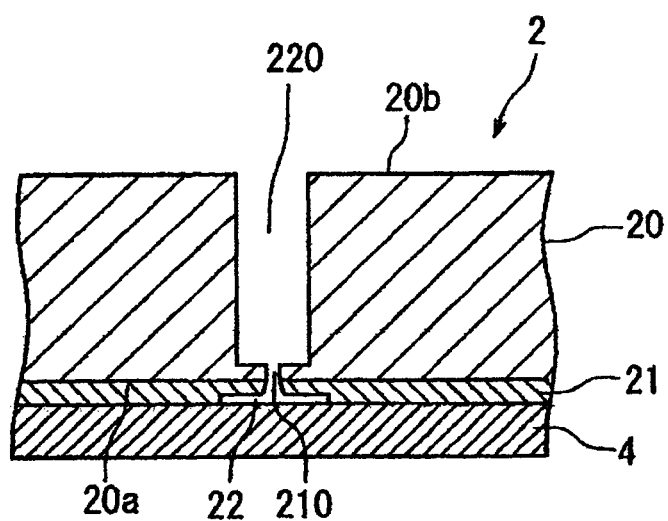
FIG. 8 is an enlarged sectional view of an essential part of a wafer processed by a modification of the cut groove forming step.

Cutting blade: outer diameter: 52 mm
thickness: 40 μm
Rotational speed of the cutting blade: 30000 rpm
Work feed speed: 50 mm/second A modification of the cut groove forming step will now be described with reference to FIG. 8. The modification shown in FIG. 8 is applied to the semiconductor wafer 2 shown in FIG. 4, wherein the laser processed groove 210 cutting the functional layer 21 is formed along each division line 22 so that the laser processed groove 210 has a depth reaching a position slightly below the front side 20a of the substrate 20 of the semiconductor wafer 2 as viewed in FIG. 4. In other words, the cut groove 220 has a depth reaching the bottom of the laser processed groove 210 as shown in FIG. 8. Accordingly, the semiconductor wafer 2 is divided into the individual devices 23 in this modification shown in FIG. 8.

Figure 9A:
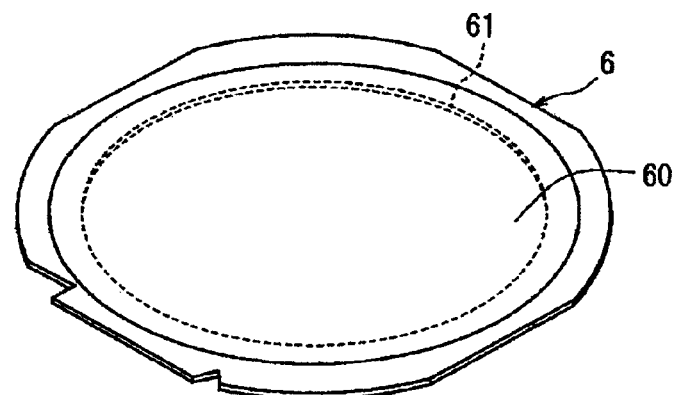
FIGS. 9A to 9C are views for illustrating a wafer supporting step.
Figure 9B:
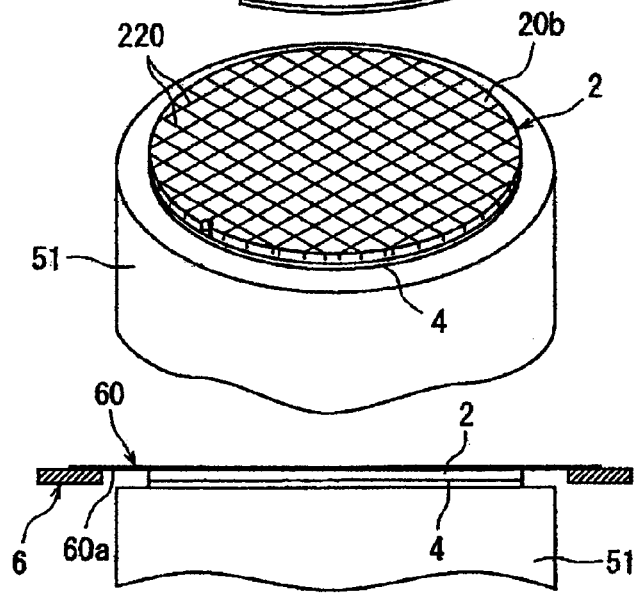
Figure 9C:
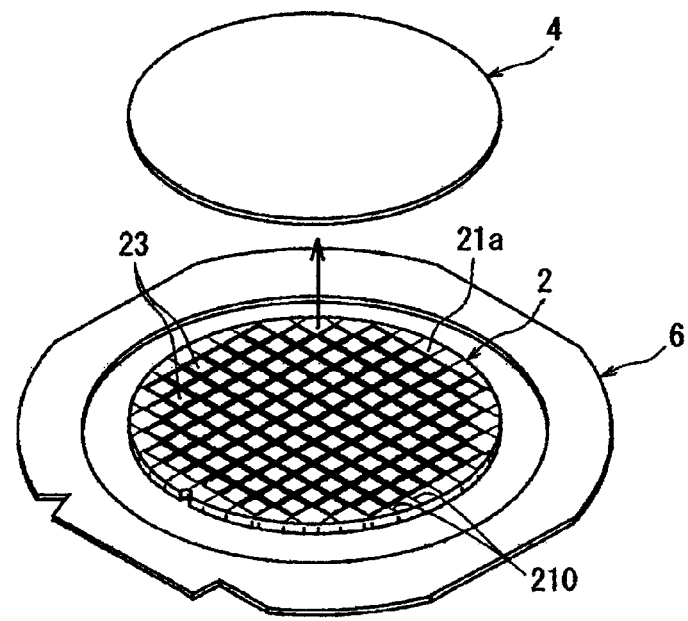

After performing the cut groove forming step mentioned above, a wafer supporting step is performed in such a manner that a dicing tape is attached to the back side 20b of the substrate 20 of the semiconductor wafer 2, the outer circumferential portion of the dicing tape is supported to an annular frame, and the protective member 4 is peeled off. This wafer supporting step will now be described with reference to FIGS. 9A to 9C. The wafer supporting step shown in FIGS. 9A to 9C is performed on the chuck table 51 used in performing the cut groove forming step. As shown in FIGS. 9A and 9B, a dicing tape 60 is preliminarily mounted at its outer circumferential portion to the back side (upper surface as viewed in FIGS. 9A and 9B) of an annular frame 6 having an opening 61 having a size capable of accommodating the semiconductor wafer 2. That is, the dicing tape 60 is supported to the annular frame 6 in such a manner as to close the opening 61 of the annular frame 6. The dicing tape 60 has a front side 60*a* (adhesive surface provided with an adhesive layer, or lower surface as viewed in FIGS. 9A and 9B). The front side 60*a* of the dicing tape 60 supported to the annular frame 6 is attached to the back side 20*b* of the substrate 20 of the semiconductor wafer 2 held on the chuck table 51. Thereafter, the protective member 4 attached to the front side 21*a* of the functional layer 21 of the semiconductor wafer 2 is peeled off as shown in FIG. 9C.

Figure 10:
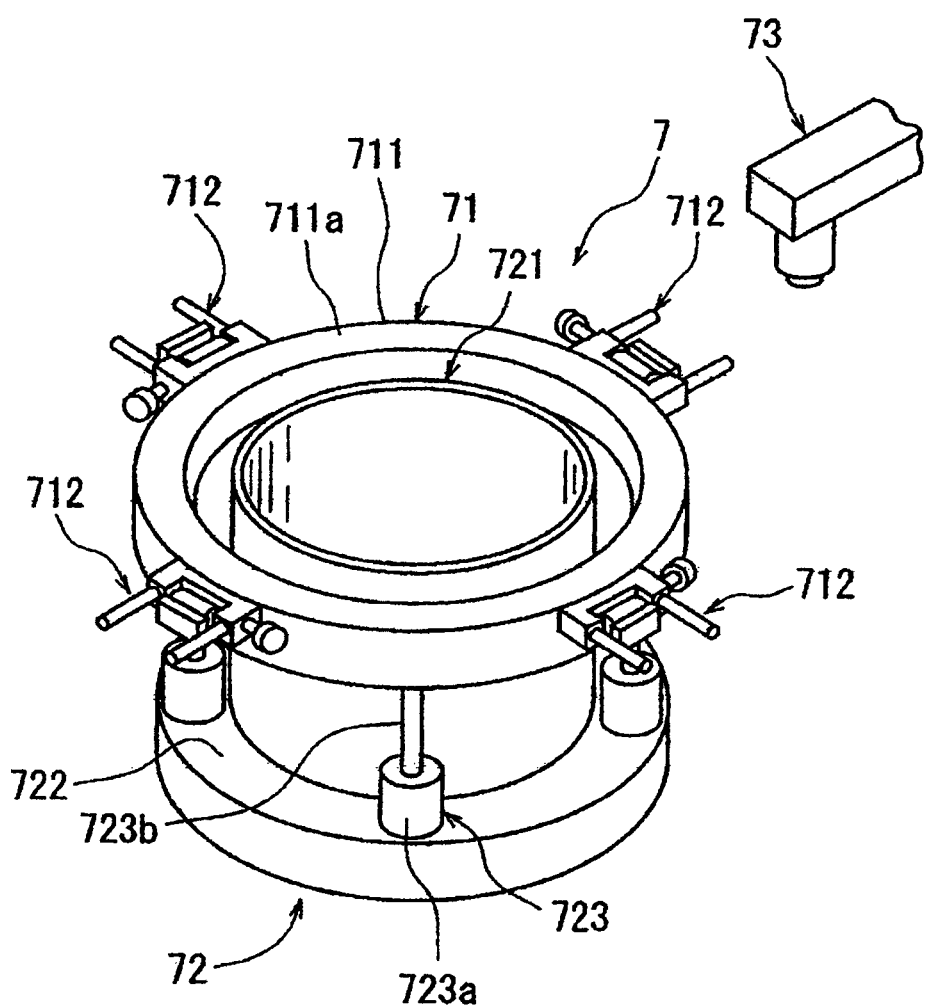
FIG. 10 is a perspective view of a tape expanding apparatus for performing a tape expanding step.

After performing the wafer supporting step mentioned above, a tape expanding step is performed in such a manner that the dicing tape 60 attached to the back side 20*b* of the substrate 20 of the semiconductor wafer 2 is expanded to increase the spacing between the devices 23. This tape expanding step is performed by using a tape expanding apparatus 7 shown in FIG. 10. The tape expanding apparatus 7 shown in FIG. 10 includes frame holding means 71 for holding the annular frame 6, tape expanding means 72 for expanding the dicing tape 60 supported to the annular frame 6 held by the frame holding means 71, and a pickup collet 73. The frame holding means 71 includes an annular frame holding member 711 and a plurality of clamps 712 as fixing means provided on the outer circumference of the frame holding member 711. The upper surface of the frame holding member 711 functions as a mounting surface 711*a* for mounting the annular frame 6 thereon. The annular frame 6 mounted on the mounting surface 711*a* is fixed to the frame holding member 711 by the clamps 712. The frame holding means 71 is supported by the tape expanding means 72 so as to be vertically movable.

Figure 11A:
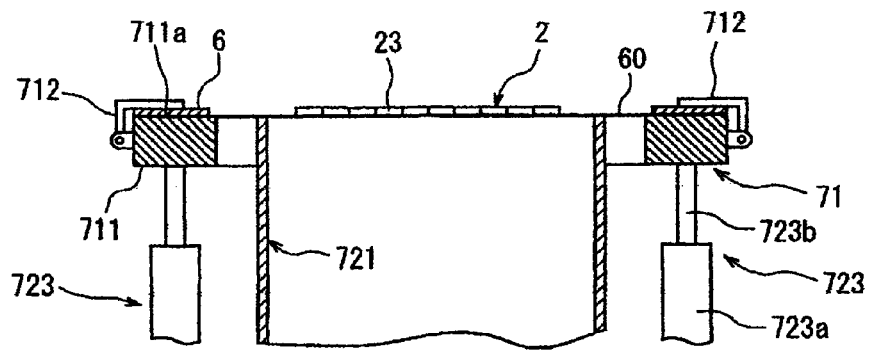
FIGS. 11A to 11C are views for illustrating the tape expanding step.
Figure 11B:
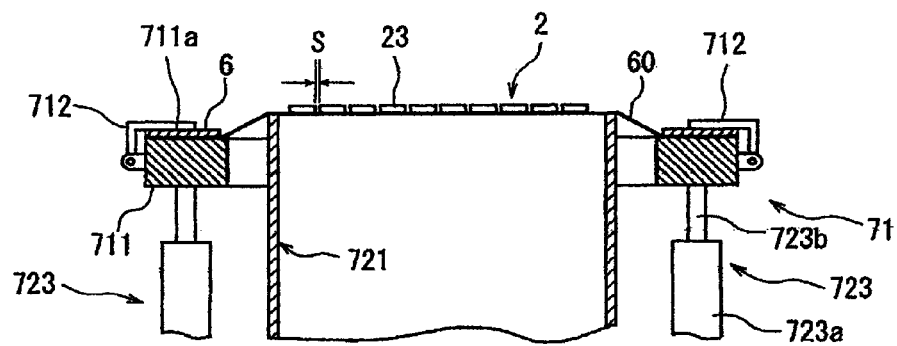

The tape expanding means 72 includes an expanding drum 721 provided inside of the annular frame holding member 711. The expanding drum 721 has an outer diameter smaller than the inner diameter of the annular frame 6 and an inner diameter larger than the outer diameter of the semiconductor wafer 2 attached to the dicing tape 60 supported to the annular frame 6. The expanding drum 721 has a supporting flange 722 at the lower end of the drum 721. The tape expanding means 72 further includes supporting means 723 for vertically movably supporting the annular frame holding member 711. The supporting means 723 is composed of a plurality of air cylinders 723*a* provided on the supporting flange 722. Each air cylinder 723*a* is provided with a piston rod 723*b* connected to the lower surface of the annular frame holding member 711. The supporting means 723 composed of these plural air cylinders 723*a* functions to vertically move the annular frame holding member 711 so as to selectively take a reference position where the mounting surface 711*a* is substantially equal in height to the upper end of the expanding drum 721 as shown in FIG. 11A and an expansion position where the mounting surface 711*a* is lower in height than the upper end of the expanding drum 721 by a predetermined amount as shown in FIG. 11B.

The tape expanding step using the tape expanding apparatus 7 will now be described with reference to FIGS. 11A to 11C. As shown in FIG. 11A, the annular frame 6 supporting the semiconductor wafer 2 through the dicing tape 60 is mounted on the mounting surface 711*a* of the frame holding member 711 of the frame holding means 71 and fixed to the frame holding member 711 by the clamps 712 (frame holding step). At this time, the frame holding member 711 is set at the reference position shown in FIG. 11A. Thereafter, the air cylinders 723*a* as the supporting means 723 of the tape expanding means 72 are operated to lower the frame holding member 711 to the expansion position shown in FIG. 11B. Accordingly, the annular frame 6 fixed to the mounting surface 711*a* of the frame holding member 711 is also lowered, so that the dicing tape 60 supported to the annular frame 6 comes into abutment against the upper end of the expanding drum 721 and is expanded as shown in FIG. 11B (tape expanding step).

As a result, a tensile force acts on the semiconductor wafer 2 attached to the dicing tape 60 in the radial direction of the semiconductor wafer 2. In the case that the cut groove 220 is formed on the back side 20*b* of the substrate 20 of the semiconductor wafer 2 in the condition where a part 201 is left near the front side 20*a* of the substrate 20 as shown in FIG. 7D, this part 201 is broken by the tensile force applied to the dicing tape 60, thereby dividing the semiconductor wafer 2 into the individual devices 23. Further, an increased spacing S is formed between any adjacent ones of the individual devices 23 divided from each other as shown in FIG. 11B. On the other hand, in the case that the cut groove 220 is formed on the back side 20*b* of the substrate 20 of the semiconductor wafer 2 in the condition where the cut groove 220 has a depth reaching the bottom of the laser processed groove 210 as shown in FIG. 8, the devices 23 have already been divided from each other, so that an increased spacing S is similarly formed between any adjacent ones of the individual devices 23 divided from each other as shown in FIG. 11B.

Figure 11C:
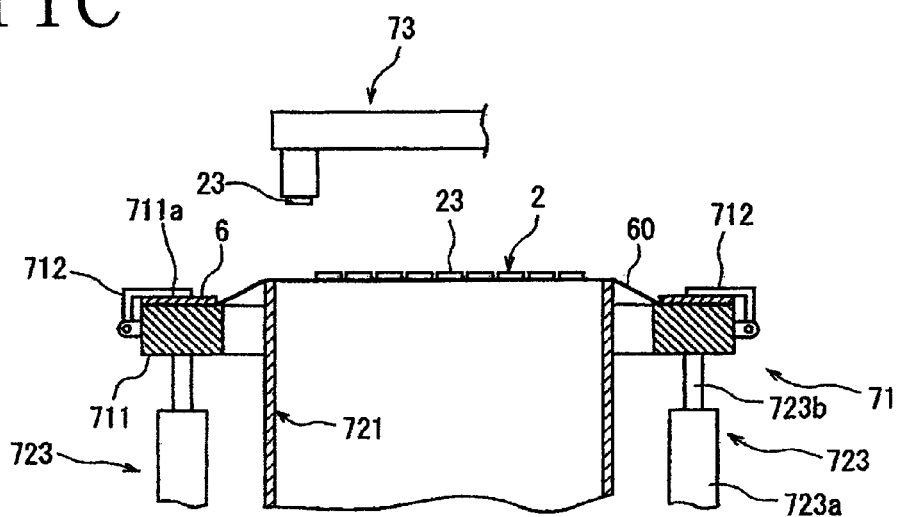

Thereafter, the pickup collet 73 is operated to hold each device 23 under suction and peel it off from the dicing tape 60, thus individually picking up the devices 23 as shown in FIG. 11C (pickup step). Thereafter, each device 23 thus picked up is transferred to a tray (not shown) or a position where a die bonding step is performed. In this pickup step, the increased spacing S is formed between any adjacent ones of the individual devices 23 attached to the dicing tape 60, so that each device 23 can be easily picked up without the contact with its adjacent device 23.

While the specific preferred embodiment of the present invention has been described above, it should be noted that the present invention is not limited to the above preferred embodiment, but various modifications may be made without departing from the scope of the present invention. In the above preferred embodiment, the cut groove forming step of positioning the cutting blade on the back side of the substrate of the wafer in the area corresponding to each division line and then rotating the cutting blade to form the cut groove having a depth not reaching the functional layer of the wafer is performed after performing the protective member attaching step of attaching the protective member to the front side of the functional layer. As a modification, a back grinding step of grinding the back side of the substrate of the wafer to reduce the thickness of the wafer to a predetermined thickness may be performed after performing the protective member attaching step and before performing the cut groove forming step.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for dividing a wafer into a plurality of individual devices along a plurality of crossing division lines, said wafer being composed of a substrate and a functional layer formed on a front side of said substrate, said division lines being formed on a front side of said functional layer to thereby define a plurality of separate regions where said devices are respectively formed, said wafer processing method comprising:

a functional layer cutting step of applying a laser beam along each division line formed on said functional layer of said wafer to thereby ablate said functional layer and form a laser processed groove cutting said functional layer along each division line;

a protective member attaching step of attaching a protective member to the front side of said functional layer of said wafer after performing said functional layer cutting step;

a cut groove forming step of holding said wafer on a chuck table in the condition where said protective member is in contact with said chuck table after performing said protective member attaching step, and next positioning a cutting blade on a back side of said substrate of said wafer in the area corresponding to each division line to form a cut groove having a depth not reaching said functional layer;

a wafer supporting step of attaching a dicing tape to the back side of said substrate of said wafer after performing said cut groove forming step, supporting an outer circumferential portion of said dicing tape to an annular frame, and next peeling off said protective member; and a tape expanding step of expanding said dicing tape attached to the back side of said substrate of said wafer to increase the spacing between said devices after performing said wafer supporting step.

2. The wafer processing method according to claim 1, wherein said cut groove formed in said cut groove forming step has a depth not reaching the bottom of said laser processed groove cutting said functional layer, and said substrate is broken along said cut groove by expanding said dicing tape in said tape expanding step to thereby divide said wafer into said individual devices.

3. The wafer processing method according to claim 1, wherein said cut groove formed in said cut groove forming step has a depth reaching the bottom of said laser processed groove cutting said functional layer, thereby dividing said wafer into said individual devices.

* * * * *